July 1, 1969 J. WYCISLAK 3,453,154
PROCESS FOR ESTABLISHING LOW ZENER BREAKDOWN
VOLTAGES IN SEMICONDUCTOR REGULATORS
Filed June 17, 1966

INVENTOR.
JOHN WYCISLAK
BY Lyon & Lyon
ATTORNEYS

United States Patent Office 3,453,154

Patented July 1, 1969

3,453,154

PROCESS FOR ESTABLISHING LOW ZENER BREAKDOWN VOLTAGES IN SEMICONDUCTOR REGULATORS

John Wycislak, West Covina, Calif., assignor, by mesne assignments, to Globe-Union Inc., Milwaukee, Wis., a corporation of Delaware Filed June 17, 1966, Ser. No. 558,469
Int. Cl. C21d 1/26; H01l 7/44, 9/00
U.S. Cl. 148—186 14 Claims

ABSTRACT OF THE DISCLOSURE

The breakdown voltage of a diffusion-produced P-N junction, such as in a Zener diode, is reduced by reheating the junction to at least 1200° C. and then cooling the reheated junction at a rate substantially greater than the rate used for cooling after the diffusion step. The breakdown voltage can be increased from this reduced level by subsequently heating the junction, such as during the firing in of electrical contacts, to a temperature of at least 550° C. and then slowly cooling the junction at a rate approximately the same as for the cooling after the diffusion step.

This invention relates to semiconductor devices and more particularly relates to a process for providing semiconductor regulators having relatively low Zener breakdown voltages.

In the manufacture of semiconductor Zener voltage regulators, two processes are generally used for establishing the P-N junction in a semiconductor wafer, namely, diffusion and alloying. In the diffusion process, a semiconductor wafer, for example of silicon, of a first conductivity type is subjected to solid state diffusion of an impurity of the opposite conductivity type inducing characteristic so that a portion of the wafer is overdoped with the impurity and a P-N junction formed. In the alloying process, a material having a conductivity type inducing characteristic opposite to that of the semiconductor wafer is alloyed to the semiconductor wafer causing a regrowth region to be formed having a conductivity type opposite to that of the remainder of the wafer whereby a P-N junction is formed.

In general, the diffusion process has a number of advantages over the alloying process and thus the majority of Zener regulators are made by the diffusion process. Because the Zener breakdown voltage ($E_z$) is a function of the resistivity of the material on either side of the junction, in order to achieve a low Zener breakdown characteristic, it is necessary to begin with material having a relatively low resistivity, typically in the range of 0.003 to 0.02 ohm-centimeter. With such low resistivity material, it has in the past been found to be impossible to reproducibly produce Zener regulators having a breakdown voltage of less than about 6.8 volts by the diffusion method. Therefore, most semiconductor regulators having a lower breakdown voltage rating are manufactured by the alloying process.

It is therefore an object of the present invention to provide a process for fabricating diffused semiconductor regulators having low breakdown voltage ratings.

It is also an object of the present invention to provide such a process which does not apreciably increase the cost of the conventional diffusion process.

These and other objects and advantages of the present invention will become more apparent upon reference to the accompanying description and drawings in which.

Briefly, the present invention is biased on the discovery that the breakdown voltage of a semiconductor diode can be altered by reannealing the diode after it has been diffused and cooled in the conventional manner. It has been found that if the diode is reannealed from a high temperature at a relatively rapid rate, the breakdown voltage is significantly reduced. By choosing the proper temperature, cooling rate and resistivity, breakdown voltages as low as 4.5 volts have been obtained. By varying the rate of cooling, a device having a single desired breakdown voltage can be fabricated from material having different initial resistivities. It has further been found that the breakdown voltage can be further changed by proper selection of the temperature at which the contacts are applied to the diode. By proper manipulation of the various parameters involved, it is thus possible to provide diffused Zener regulators having any desired breakdown voltage down to about 4.5 volts.

Figure 1:
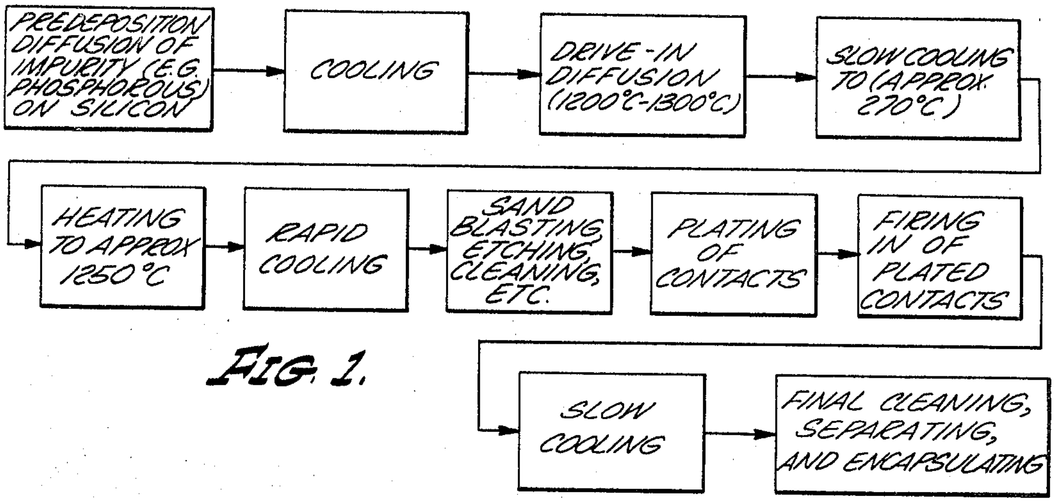
FIGURE 1 is a diagrammatic representation of the process of the present invention.

Turning now to FIGURE 1, there is shown a diagrammatic representation of the process of the present invention. While the invention will be described with reference to a wafer of P-type silicon into which phosphorus is diffused, it should be understood that other semiconductor materials and other impurities could be used and the present description is therefore to be taken as illustrative only and not limiting. It should also be understood that the apparatus used in the process of the present invention is conventional and that therefore no extended discussion of this apparatus will be given.

In the process of the present invention, the P-type silicon slice (or slices) is placed in a diffusion furnace at a temperature of approximately 1250° C.–1300° C. A quratz source boat filled with $P_2O_5$ powder is placed in a source furnace adjacent the diffusion furnace, the temperature in the source furnace being approximately 600° C. A stream of nitrogen is then directed across the source boat and into the diffusion furnace so that phosphorus is deposited on the slice and same diffusion takes place.

After thirty minutes of this predeposition diffusion, the slice is pulled to the center of a cooling furnace which is at a temperature of approximately 900° C. The cooling furnace is then turned off and the slice allowed to cool in accordance with the furnace profile.

After cooling, the slice is placed in a diffusion furnace for the drive-in diffusion. This furnace can either be the same as or similar to the predeposition furnace. The diffusion furnace is maintained at a temperature of 1250° C.–1300° C. for thirty minutes and the furnace then shut off. The slice is cooled at the natural rate of cooling of the furnace. When the temperature of the furnace drops to about 270° C., the silicon slice can be removed from the furnace. All of the foregoing procedures and the equipment used therein, are conventional and are customarily used for fabricating diffused Zener diodes. In the conventional process, the slice is now sandblasted, etched and cleaned and contacts applied. The slice is then cut up into individual diodes which are then encapsulated to form the finished product.

In the process of the present invention, however, the slices are subjected to an additional step, this additional step serving to reduce the breakdown voltage of the diodes. After the slice has been cooled, it is placed in another furnace, which can be similar to the diffusion furnace, and which is maintained at a temperature of approximately 1300° C. The slice is left in this furnace for about five minutes until it has been raised to a temperature of about 1300° C. It is then rapidly cooled, preferably by being withdrawn at a predetermined speed from the furnace. It has been found that this reheating and rapid cooling, or reannealing, serves to drive the breakdown voltage of the diodes downward without otherwise affecting the characteristics of the diodes.

Figure 2:
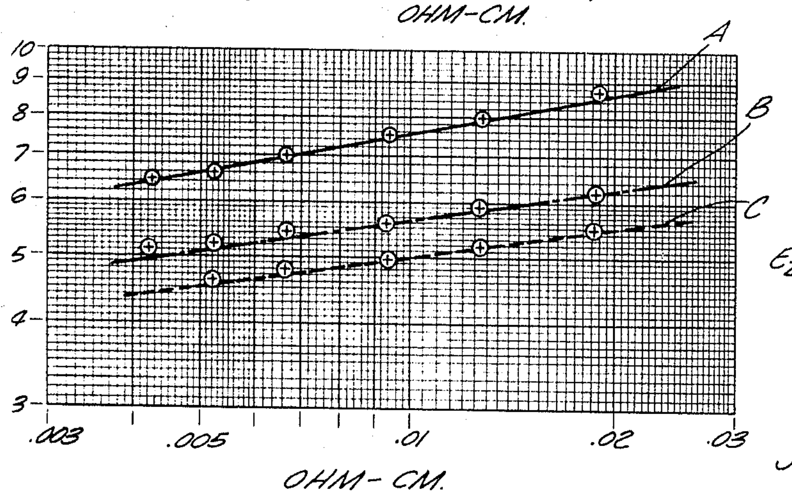
FIGURE 2 shows a family of curves resulting from completion of a first portion of the process of the present invention.

The effect of this reannealing on silicon of typical resistivities is shown in FIGURE 2. FIGURE 2 is a plot of breakdown voltage $E_z$ at 7.5 milliamperes against resistivity in ohm-centimeters. Curve A shows the breakdown voltage of diodes made with silicon of different resistivities when the diodes are made in the conventional manner and are not reannealed. As can be seen, the use of the material having a resistivity of about 0.004 ohm-centimeter resulted in a diode having a breakdown voltage of about 6.4 volts. When material having a resistivity of about 0.0052 ohm-centimeter was used, the resultant diode had a breakdown voltage of about 6.6 volts. The use of a material having a resistivity of 0.019 ohm-centimeter resulted in a diode having a breakdown voltage of about 8.6 volts.

Curve B, plotted on a logarithmic scale, shows the reduction in breakdown voltages achieved for diodes made of the same resistivity material as in curve A by the use of the reannealing step of the present invention. The results of curve B were obtained by using a furnace 30 inches long, the central 12 inches of which were maintained at approximately 1300° C. The exit temperature of the furnace was about 400° C. Each of the slices treated was placed in the center of the furnace and left there for five minutes until it was raised in temperature to approximately 1300° C. It was then withdrawn from the furnace at a rate of 90 seconds per inch. The slice was thus in the 1300° C. zone for 540 seconds and in the adjacent zone, where the temperature decreased from 1300° C. to 400° C., for 810 seconds.

As a result of this treatment, the breakdown voltage of a diode made from material having a resistivity of 0.0042 ohm-centimeter was reduced to approximately 5.1 volts; the breakdown voltage of the 0.0052 ohm-centimeter material reduced to 5.2 volts; and the breakdown voltage of the 0.0019 ohm-centimeter material reduced to 6.2 volts.

Curve C of FIGURE 2 shows the result of increasing the withdrawal rate of the slices from the reannealing furnace to 3 seconds per inch. In all other respects, these slices were treated in the same manner as were the slices used to make up curve B. As can be seen from curve C, the breakdown voltage of a diode made from material having a resistivity of 0.0052 ohm-centimeter was reduced to 4.6 volts; the breakdown voltage of a diode made from 0.0066 ohm-centimeter material was reduced to 4.8 volts from the 7.0 volts of curve A and the breakdown voltage of a device made from 0.019 ohm-centimeter material was reduced to 5.5 volts from the 8.6 volts of curve A.

While curves B and C of FIGURE 2 show representative breakdown voltages that can be obtained by the process of the present invention, it should be understood that they are merely representative and that other voltages can be obtained using materials having the same resistivity, or the same voltages can be obtained by using materials having different resistivities. This can be accomplished by varying the rate at which the slice is pulled from the furnace. Thus, if it was desired to establish a breakdown voltage of 5.1 volts in material having a resistivity of 0.0052 ohm-centimeter, the rate of withdrawing the slice would be increased over the rate used in plotting curve B. If a higher breakdown voltage was desired using the same resistivity material, the withdrawal rate would be slowed down relative to the rate used in plotting curve B.

Because the number of possible variations of resistivity and withdrawal rate are practically infinite, no effort is made herein to attempt to discuss them all. It has been found however that the cooling rate of the slice during reannealing must be substantially greater than the rate at which the slice is cooled after diffusion, and that withdrawal rates of faster than about 2 seconds per inch generally shock the silicon and cause dislocations therein and thus are not useful in the practice of the present invention. It has also been found that the temperature of the reannealing furnace must be above 1200° C. in order to affect the breakdown voltage. The upper temperature limit is the temperature at which the doped silicon melts. Preferably, the slice is not heated to above 1325° C. in the reannealing furnace. No appreciable effect in breakdown voltage has been ascertained that can be traced to differences in furnace temperature so long as the reannealing furnace temperature is kept between 1200° C.–1325° C. The manner in which the withdrawal rate must be selected to obtain a desired breakdown voltage from a material having a given resistivity will be apparent to one skilled in the art from the foregoing description.

It should be understood that while reannealing has been discussed in terms of the withdrawal rate of the slice from the furnace, the reannealing could equally well be performed by providing the furnace with an equivalent cooling profile, and such is intended to be covered by the present invention. It is quite difficult, however, to provide a furnace with a variable cooling profile and consequently the technique of withdrawing the slice from the furnace, which can be done with a simple variable speed drive, is preferred.

After the slice has been reannealed and the cooling completed, it is sandblasted, etched and cleaned in the conventional manner, contacts applied, and the slice divided up into a plurality of diodes. The contacts can be applied in any conventional manner but it has been found that if fired-in plated nickel contacts are used, the breakdown voltage of the individual diodes can be further changed, in this case increased. It has been found that the higher the temperature at which the nickel is fired in, the higher the breakdown voltage is raised. It is believed that this results because the firing-in step is essentially a second reannealing where the cooling rate is slower than in the first reannealing and that this slow cooling causes the breakdown voltage to again rise.

Figure 3:
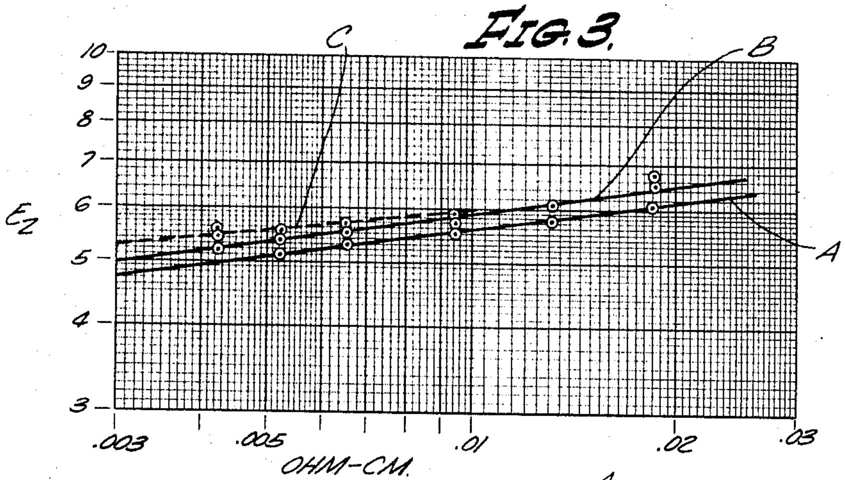
FIGURE 3 shows a family of curves resulting after an additional step of the process of the present invention is completed.

Typical effects of this nickel firing are shown in FIGURE 3. In FIGURE 3, curve A shows the breakdown voltage, plotted against resistivity, of devices which have not been nickel fired. Curve B shows the breakdown voltages for diodes of the same resistivity material after nickel firing, in this instance at 700° C. for 10 minutes, after which the furnace was turned off and allowed to cool at its normal cooling rate in the conventional manner. As can be seen, the breakdown voltage of a diode constructed of 0.0052 ohm-centimeter material was raised from 5.2 volts to approximately 5.4 volts by this nickel firing. When the firing temperature was raised to 900° C., the curve C resulted. The firing at 900° C. caused the breakdown voltage of the 0.0052 ohm-centimeter material to be raised to approximately 5.6 volts. As will be obvious to one skilled in the art, the firing temperature can be varied for any particular resistivity material to achieve a relatively wide range of breakdown voltages. It has been found that the nickel must be fired in at about 550° C. to have any effect on the breakdown voltage and that this effect is not appreciable until the firing temperature is raised about 600° C. It has also been found as can be seen from FIGURE 3, that when the resistivity exceeds about 0.01 ohm-centimeter, a difference in firing temperature makes no appreciable difference in the breakdown voltage.

From a practical standpoint, this variation of the breakdown voltage at the time of nickel firing has been found to be very valuable. In practice, the process described above, prior to the nickel plating, is used to produce slices having thereon a plurality of diodes having a uniform breakdown voltage, for example, 5.2 volts. The slices containing these diodes are then placed in stock until diodes having a specified breakdown voltage between, for example, 5.4 and 6.0 volts are required. Slices of appropriate resistivity are then plated and the nickel fired in at the proper temperature to raise the breakdown voltage from 5.2 volts to the desired final voltage. The slice is then subjected to final cleaning, and separated into the individual diodes which are then encapsulated. In this manner, the inventory of diodes can be substantially reduced.

From the foregoing description, it can be seen that a process has been provided for producing diffused zener diodes having breakdown voltages lower than theretofore obtainable. While specific parameters of the process have been described, it should be understood that various changes can be made in these parameters while still practicing the present invention. The scope of the present invention is therefore not to be measured by the foregoing description but rather by the appended claims.

I claim:

1. In a process for producing a P-N junction which includes the steps of diffusing an impurity of a first electrical conductivity type at an elevated temperature into a body of semiconductive material of the opposite electrical conductivity type to form said P-N junction and then cooling said body to a temperature substantially below the diffusion temperature, wherein the improvement comprises reheating said cooled body to a temperature of at least 1200° C. and then cooling said reheated body at a rate substantially greater than the cooling rate of said body after said diffusing to produce a P-N junction having a reduced breakdown voltage at a predetermined value.

2. The process of claim 1 wherein said semiconductor material is P-type silicon and said impuritiy is phosphorus.

3. The process of claim 2 wherein said reheating temperature is in the range of 1200° C to 1325° C.

4. The process of claim 3 wherein the maximum cooling rate of said reheated body is equivalent to reducing the temperature of said reheated body from said reheated temperature to 400° C. in a minimum time of no less than 18 seconds.

5. In a process for producing a Zener diode which includes the steps of diffusing an impurity of a first electrical conductivity type at an elevated temperature into a body of semiconductive material of the opposite electrical conductivity type to form two contiguous regions in said body separated by a P-N junction, then cooling said body to a temperature substantially below said diffusion temperature, and attaching electrical contacts to said two regions, the improvement which comprises reheating said cooled body to a temperature of at least 1200° C., cooling said reheated body at a rate substantially greater than the cooling rate of said body after said diffusion to produce a Zener diode having a reduced reverse breakdown voltage at a predetermined value.

6. The process of claim 5 wherein said semiconductor material is P-type silicon and said impurity is phosphorous.

7. The process of claim 6 wherein said reheating temperature is in the range of 1200° C. to 1325° C.

8. The process of claim 7 wherein the maximum cooling rate of said reheated body is equivalent to reducing the temperature of said reheated body from said reheated temperature to 400° C. in a minimum time of no less than 18 seconds.

9. The process of claim 8 wherein the rate of cooling of said reheated body is equivalent to reducing the temperature of said reheated body from a temperature of 1300° C. to a temperature of 400° C. in 27 to 810 seconds.

10. The process of claim 8 further comprising reheating said body for a second time to a temperature of at least 550° C. and then cooling said body at a rate less than the rate of cooling after diffusion so as to increase said reduced reverse breakdown voltage to a predetermined value.

11. The process of claim 10 wherein said second reheating is carried out during the application of said electrical contacts.

12. The process of claim 11 wherein said contacts are applied by firing in nickel.

13. The process of claim 12 wherein said nickel is fired in at a temperature of between 700° C. and 900° C.

14. A process for fabricating a Zener diode having a reverse breakdown voltage of less than 6.0 volts comprising:

diffusing phosphorus into a body of P-type silicon at a temperature greater than 1200° C. to form in said body two contiguous regions separated by a P-N junction;

cooling said body to a temperature below 270° C. at a relatively slow rate;

inserting said body into a furnace having an internal temperature in excess of 1200° C. to raise the temperature of said body to greater than 1200° C., said furnace having an exit temperature of less than approximately 400° C.;

withdrawing said body from said furnace at a rate such that said body cools from said temperature in excess of 1200° C. to said temperature of approximately 400° C. in between approximately 27 and 810 seconds, said cooling rate being substantially faster than the rate used to cool said body to below said 270° C., whereby the reverse breakdown voltage of said junction is reduced;

plating portions of said two regions with nickel; and firing in said nickel at a temperature of at least 550° C. and then cooling said body at a rate less than the rate used to cool said body to said approximately 400° C. to increase the reverse breakdown voltage of said junction above said reduced voltage.

References Cited

UNITED STATES PATENTS

| | | | |
|---|---|---|---|
| 2,694,168 | 11/1954 | North et al. | 148—1.5 X |
| 2,702,360 | 2/1955 | Giacoletto. | |
| 2,819,191 | 1/1958 | Fuller | 148—1.5 |
| 3,100,166 | 8/1963 | Marinace | 148—175 X |
| 3,194,700 | 7/1965 | Grimmeiss et al. | 148—189 X |
| 3,314,832 | 4/1967 | Raithel | 148—186 |
| 3,356,543 | 12/1967 | Desmond et al. | 148—186 |

L. DEWAYNE RUTLEDGE, *Primary Examiner.*

R. A. LESTER, *Assistant Examiner.*

U.S. Cl. X.R.

29—589; 148—1.5, 13, 181, 185, 188, 189